(12) United States Patent
Lee et al.

(10) Patent No.: US 6,838,369 B2
(45) Date of Patent: Jan. 4, 2005

(54) METHOD FOR FORMING CONTACT HOLE OF SEMICONDUCTOR DEVICE

(75) Inventors: Ho Seok Lee, Gyeonggi-do (KR); Dong Sauk Kim, Seoul (KR); Jin Woong Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 9 days.

(21) Appl. No.: 10/608,116

(22) Filed: Jun. 30, 2003

(65) Prior Publication Data

US 2004/0214421 A1 Oct. 28, 2004

(30) Foreign Application Priority Data

Apr. 11, 2003 (KR) .................................. 10-2003-0023022

(51) Int. Cl.⁷ ......................................... H01L 21/4763
(52) U.S. Cl. ...................... 438/622; 438/624; 438/637; 438/723; 438/724; 438/725; 438/738; 438/743; 438/744; 438/902; 438/906; 438/963
(58) Field of Search ................................ 438/622, 624, 438/637, 723–725, 738, 743–744, 902, 906, 963, 677

(56) References Cited

U.S. PATENT DOCUMENTS 5,963,840 A * 10/1999 Xia et al. .................. 438/783
6,239,014 B1 * 5/2001 Liaw ......................... 438/616
6,562,416 B2 * 5/2003 Ngo et al. .................. 438/622
2002/0009893 A1 * 1/2002 Chung et al. ............... 438/710

OTHER PUBLICATIONS

Ho Seok Lee, "Characterization of the post dry–etch treatment of the cleanness of submicron contact hole bottoms", SEMI Technology Symposium 2003, SEMICON Korea STS 2003, Jan. 22, 2003, pp. 57, 59, 61–70.

* cited by examiner

Primary Examiner—Lynne A. Gurley
(74) Attorney, Agent, or Firm—Heller Ehrman White and McAuliffe LLP

(57) ABSTRACT

A method for forming a contact hole of a semiconductor device, wherein a polymer residual on a bottom surface of the contact hole is treated with plasma of mixture gas containing oxygen to convert the polymer residual into a pure silicon oxide film free of carbon and fluorine for easy removal in a subsequent washing process is disclosed. The method comprises (a) sequentially forming a capping layer and a planarized interlayer insulating film on a semiconductor substrate having a predetermined lower structure; (b) selectively etching the interlayer insulating film to expose a predetermined region of the capping layer; (c) removing the exposed capping layer; (d) subjecting the resulting structure to a plasma treatment using a mixture gas containing oxygen; and (e) performing a cleaning process.

4 Claims, 6 Drawing Sheets

METHOD FOR FORMING CONTACT HOLE OF SEMICONDUCTOR DEVICE

BACKGROUND OF THE INVENTION

1. Field of the Invention

The present invention relates to a method for forming a contact hole of a semiconductor device, and more specifically, to a method for forming a contact hole of a semiconductor device, wherein a contact hole is treated with a plasma of mixture gas containing oxygen to remove a polymer residual at the bottom of the contact hole for reducing contact resistance of a cell.

2. Description of the Prior Art

As the size of a cell is reduced due to high integration of a semiconductor device, it is critical to reduce the contact resistance of the cell.

FIGS. 1a through 1c are cross-sectional diagrams illustrating a conventional method for forming a contact hole of a semiconductor device.

Referring to FIG. 1a, a stacked structure of a conductive pattern 12 and a hard mask film 14 are formed on a semiconductor substrate 10. A nitride film (not shown) is formed on the entire surface of the resulting structure, and then blanket-etched to form a spacer 16 on sidewalls of the stacked structure of the conductive pattern 12 and the hard mask film 14. Thereafter, a capping layer 18 is formed on the entire surface of the resulting structure by depositing a nitride film, a carbide film or an alumina film.

Next, an interlayer insulating film 20 is formed on the entire surface of the resulting structure by depositing a BPSG (borophospho silicate glass) oxide film, a PSG (phospho silicate glass) oxide film, a TEOS (tetraethyl ortho silicate) oxide film, a PE-TEOS (plasma enhanced-tetraethyl ortho silicate) oxide film, an $O_3$-TEOS ($O_3$-tetraethyl ortho silicate) oxide film, a HDP (high density plasma) oxide film, an APL (advanced planarization layer) oxide film or a USG (undoped silicate glass) oxide film.

The nitride film, the carbide film or the alumina film which constitutes the capping layer 18 has selectivity over the oxide film which constitutes the interlayer insulating film 20.

Thereafter, a photoresist film (not shown) is formed on the interlayer insulating film 20, and then selectively exposed and developed to form a photoresist film pattern 22 which is a contact mask.

Referring to FIG. 1b, the interlayer insulating film 20 is selectively etched using the photoresist film pattern 22 as an etching barrier until the capping layer 18 is exposed to form a contact hole 24.

Thereafter, the residual photoresist film pattern 22 is removed using $O_2$ plasma. The capping layer 18 at the bottom of the contact hole 24 is then etched using plasma of $CF_4/CHF_3/Ar$ mixture gas or plasma of $CHF_3/O_2/Ar$ mixture gas to expose an active region. An undesired polymer residual 26, which is an oxide film containing carbon or fluorine, remains at the bottom of the contact hole 24.

Then, the resulting surface is cleaned via a wet process using HF or 1OE (Buffered Oxide Etch, $NH_4F$+HF) to remove the polymer residual 26.

The polymer residual 26 at the bottom of the contact hole 24 consists of complex film materials such as $Si_xO_yF_z$, $Si_xC_y$ or $Si_xO_yN_z$. The oxide film of $Si^+$, $Si^{2+}$ or $Si^{3+}$ still remains even after the cleaning process prior to a deposition of conductive layer material. The residual oxide film remaining at the interface of the active region and the conductive layer increases contact resistance, and cause a delay in a data read/write operation, which degrades characteristics of a device.

Therefore, the required time period for the cleaning process must be increased to remove the residual oxide film, which results in the damage of the interlayer insulating film 20, and insufficient margin of an isolation film for isolating contacts.

Moreover, since the oxide film of $Si^+$, $Si^{2+}$ or $Si^{3+}$ may not be completely removed even when the time period for the cleaning process is increased, it is difficult to obtain a clean interface of the active region and the conductive layer.

Referring to FIG. 1c, a conductive layer 30 such as a polysilicon layer or a metal layer is deposited on the entire surface of the resulting structure, and then planarized to form a poly-plug or a metal line (not shown).

SUMMARY OF THE INVENTION

It is an object of the present invention to provide a method for forming a contact hole of a semiconductor device, wherein a polymer residual at the bottom of the contact hole is converted into a pure silicon oxide film which is free of carbon or fluorine to be easily removed in a subsequent cleaning process for reducing contact resistance of a cell.

In order to achieve the object of the invention, there is provided a method for forming a contact hole of a semiconductor device, comprising the steps of:

(a) sequentially forming a capping layer and a planarized interlayer insulating film on a semiconductor substrate having a predetermined lower structure;

(b) selectively etching the interlayer insulating film to expose a predetermined region of the capping layer;

(c) removing the exposed capping layer;

(d) subjecting the resulting structure to a plasma treatment using a mixture gas containing oxygen; and (e) performing a cleaning process.

The plasma treatment is preferably performed using a plasma of $NF_3/O_2/He$ mixture gas, plasma of $Ar/O_2$ mixture gas, plasma of $CF_4/o_2$ mixture gas or plasma of $CF_4/O_2/Ar$ mixture gas.

The step (b), (c) and (d) are preferably performed in a same chamber without intermittence.

The step (d) is preferably performed in an ex-situ process in a separate plasma chamber.

DETAILED DESCRIPTION OF THE PREFERRED EMBODIMENTS

Hereinafter, the present invention will be described in more detail with reference to the accompanying drawings.

FIGS. 2a through 2d are cross-sectional diagrams illustrating a method for forming a contact hole of a semiconductor device in accordance with the present invention.

Figure 1A:
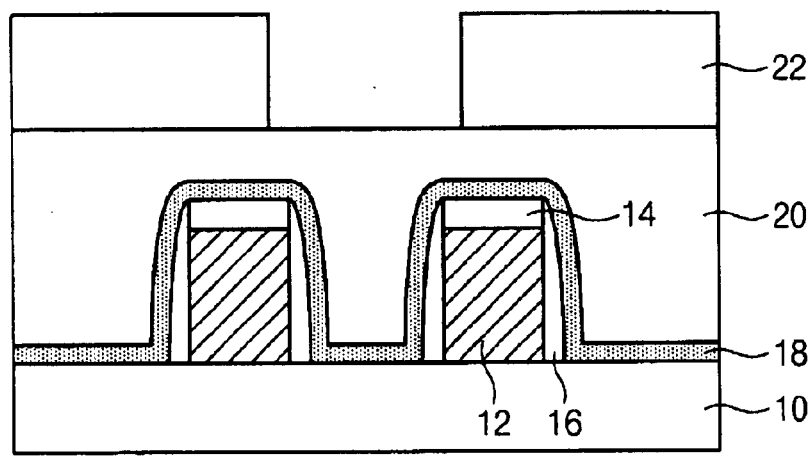
FIGS. 1a through 1c are cross-sectional diagrams illustrating a conventional method for forming a contact hole of a semiconductor device.
Figure 1B:
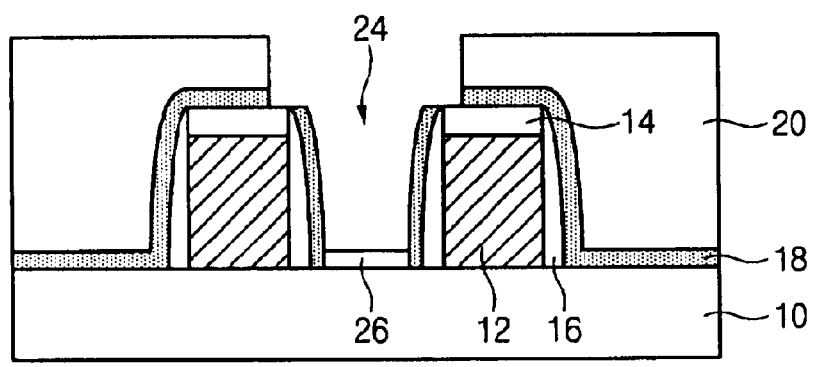
Figure 1C:
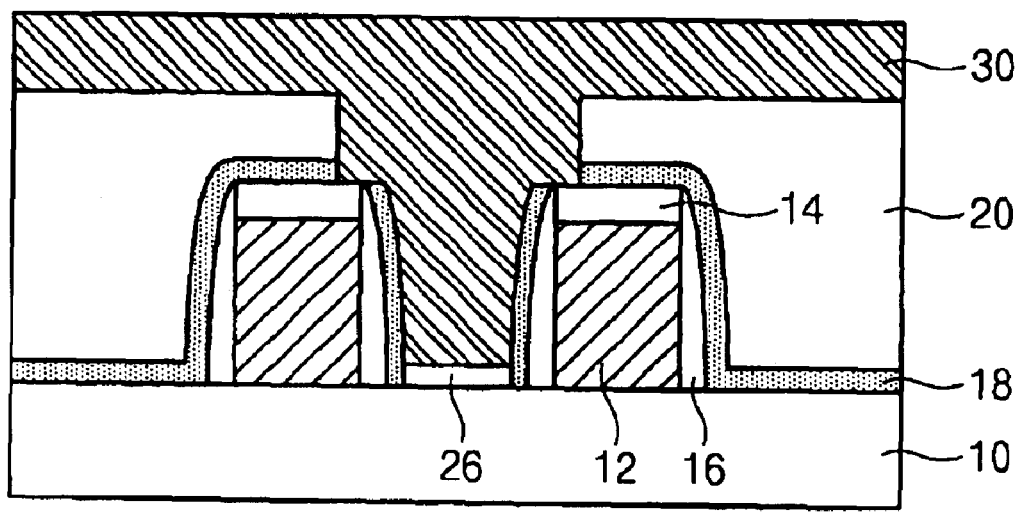
Figure 2A:
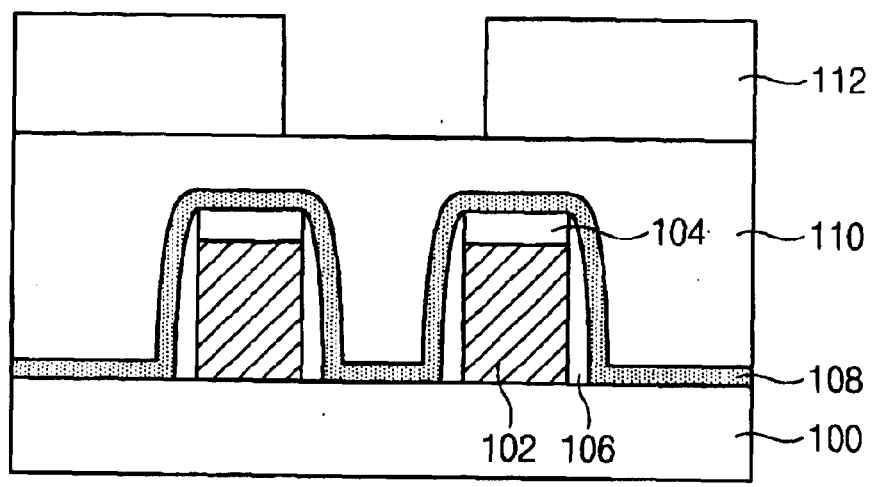
FIGS. 2a through 2d are cross-sectional diagrams illustrating a method for forming a contact hole of a semiconductor device in accordance with the present invention.

Referring to FIG. 2a, a stacked structure of a conductive pattern 102 and a hard mask film 104 is formed on a semiconductor substrate 100. A nitride film (not shown) is formed on the entire surface of the resulting structure, and then blanket-etched to form a spacer 106 on sidewalls of the stacked structure of the conductive pattern 102 and the hard mask film 104. Thereafter, a capping layer 108 is formed on the entire surface of resulting structure by depositing a nitride film, a carbide film or an alumina film.

The conductive pattern 102 may be a gate line, a bitline, a storage pattern or a metal wire line.

Then, a planarized interlayer insulating film 110 is formed on the entire surface of resulting structure by depositing a BPSG (borophospho silicate glass) oxide film, a PSG (phospho silicate glass) oxide film, a TEOS (tetraethyl ortho silicate) oxide film, a PE-TEOS (plasma enhanced-tetraethyl ortho silicate) oxide film, an $O_3$-TEOS ($O_3$-tetraethyl ortho silicate) oxide film, a HDP (high density plasma) oxide film, an APL (advanced planarization layer) oxide film or a USG (undoped silicate glass) oxide film.

The nitride film, the carbide film or an alumina film which constitutes the capping layer 108 has selectivity over the oxide film which constitutes the interlayer insulating film 110.

Thereafter, a photoresist film (not shown) is formed on the interlayer insulating film 110, and then selectively exposed and developed to form a photoresist film pattern 112 which is a contact mask.

Figure 2B:
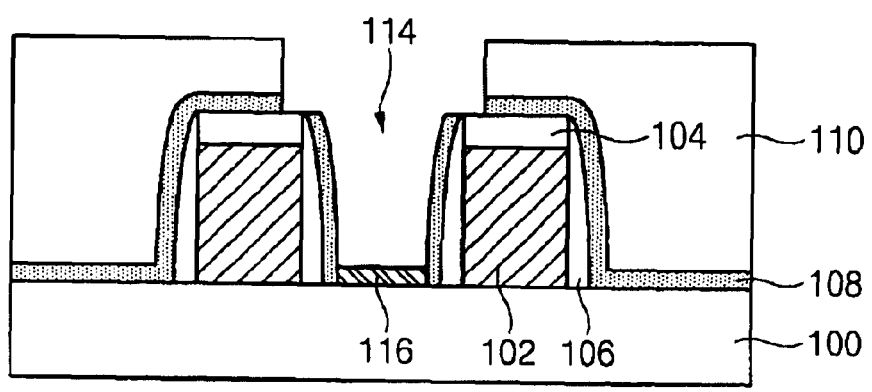

Referring to FIG. 2b, the interlayer insulating film 110 is selectively etched using the photoresist film pattern 112 as an etching barrier until the capping layer 108 is exposed to form a contact hole 114.

Thereafter, the residual photoresist film pattern 112 is removed using $O_2$ plasma. The capping layer 108 at the bottom of the contact hole 114 is then etched using plasma of $CF_4/CHF_3/Ar$ mixture gas or plasma of $CHF_3/O_2/Ar$ mixture gas to expose an active region. As undesired polymer residual 116, which is an oxide film containing carbon or fluorine, remains at the bottom of the contact hole 114.

Figure 2C:
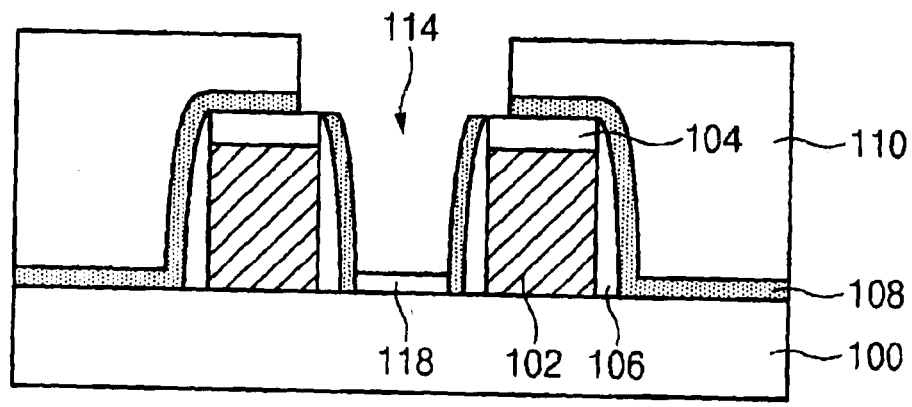

Referring to FIG. 2c, the contact hole 114 having the polymer residual 116 is treated with plasma of mixture gas containing oxygen. The polymer residual 116 is converted into a silicon oxide film 11B which is a pure oxide film free of carbon and fluorine.

The plasma of mixture gas containing oxygen is preferably selected from the group consisting of plasma of $NF_3/O_2/He$ mixture gas, plasma of $Ar/O_2$ mixture gas, plasma of $CF_4/O_2$ mixture gas and plasma of $CF_4/O_2/Ar$ mixture gas.

The plasma treatment is preferably performed in an in-situ process in an etching chamber without intermittence, or preferably performed in an ex-situ process in a separate plasma chamber.

Next, the resulting structure is cleaned via a wet process using HF or BOE (Buffered Oxide Etch, $NH_4F+HF$) to remove the silicon oxide film 118 formed at the lower portion of the contact hole 114. The silicon oxide film 118 is relatively easily etched compared to the materials that constitute the interlayer insulating film 110, minimizing the damage of the interlayer insulating film 110.

Figure 2D:
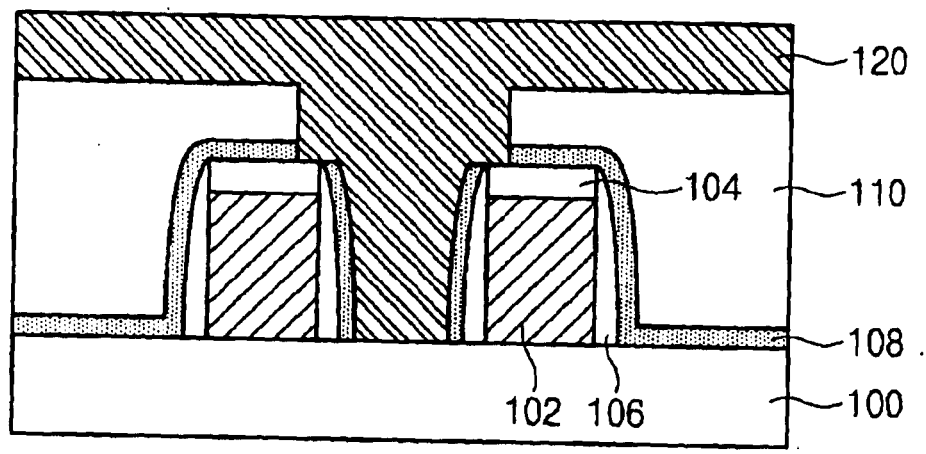

Referring to FIG. 2d, a conductive layer 120 such as a polysilicon layer or a metal layer is deposited on the entire surface of the resulting structure, and then planarized to form a poly-plug or a metal line (not shown).

FIGS. 3a through 3d are graphs illustrating analysis results of the surface of the contact hole in each treatment step of the method in accordance with the present invention. As shown in FIGS. 3a to 3d, foreign substances are easily removed when the contact hole is treated using plasma of mixture gas containing oxygen prior to the cleaning process.

Figure 3A:
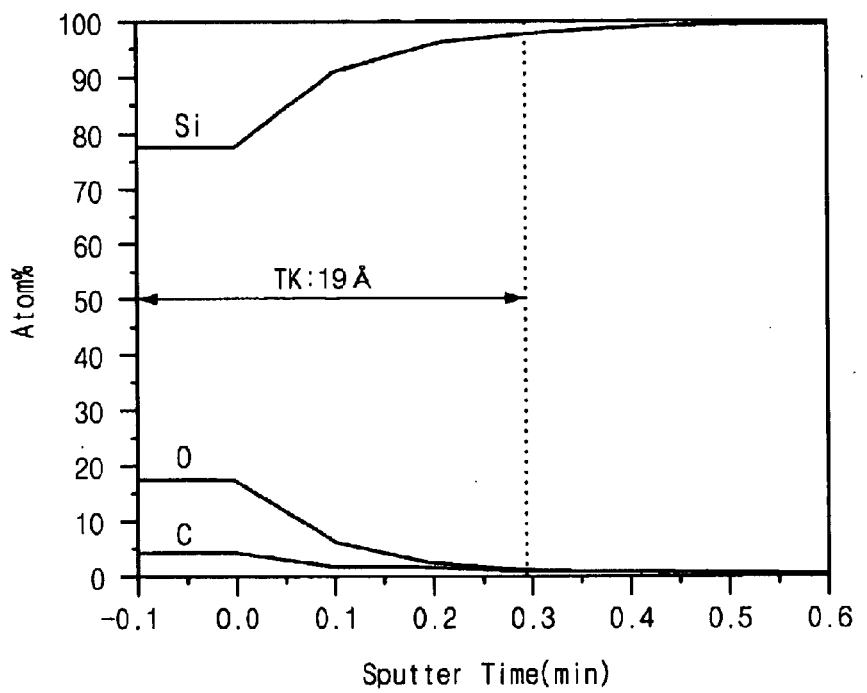
FIGS. 3a through 3d are graphs illustrating analysis results of the surface of the contact hole in each step of the method in accordance with the present invention.

Referring to FIG. 3a, the graph shows analysis results of the surface of the contact hole 114 after removing the photoresist film pattern 112.

Figure 3B:
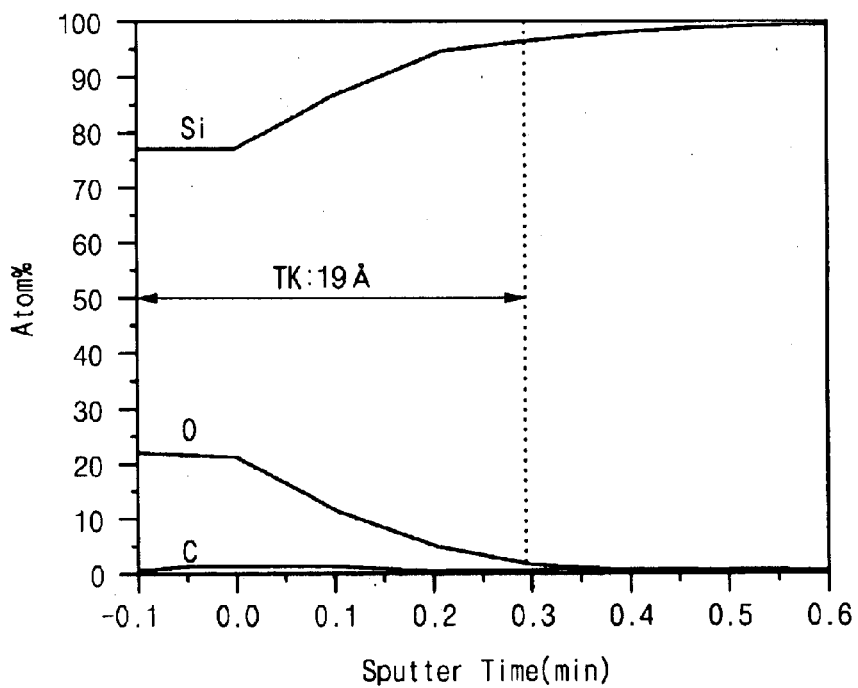

Referring to FIG. 3b, the graph shows analysis results of the surface of the contact hole 114 after the treatment of the contact hole 114 using plasma of mixture gas containing oxygen.

Figure 3C:
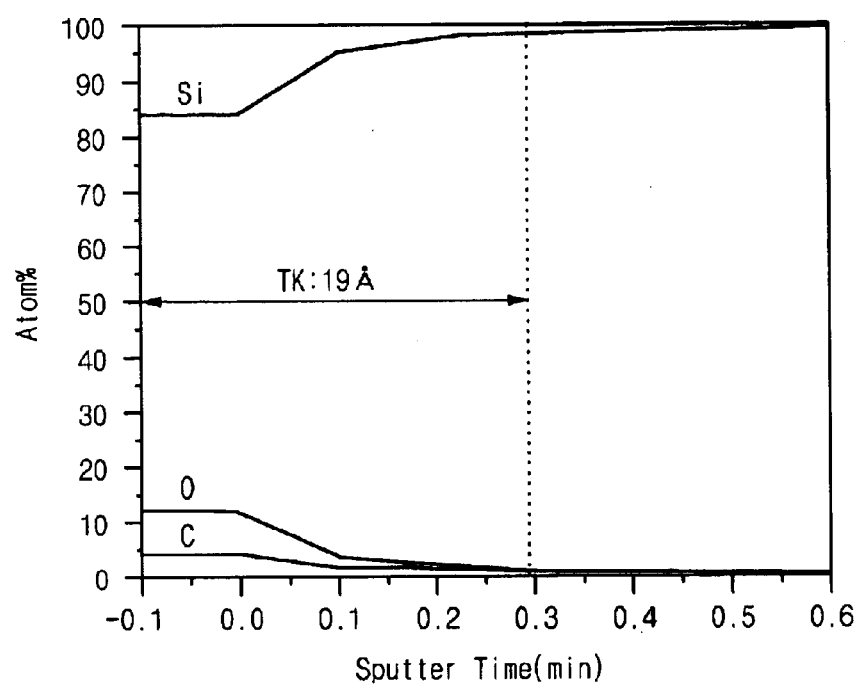

Referring to FIG. 3c, the graph shows analysis results of the surface of the contact hole 114 after the cleaning process of the contact hole 114 via a wet cleaning process without the plasma treatment.

Figure 3D:
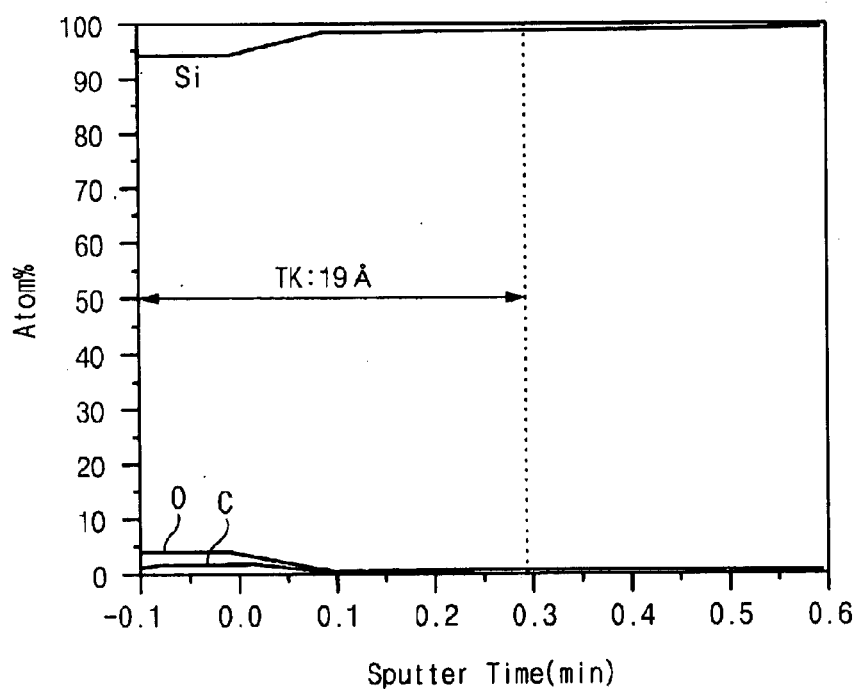

Referring to FIG. 3d, the graph shows analysis results of the surface of the contact hole 114 after the cleaning process of the contact hole 114 via a wet cleaning process with the preceding plasma treatment in accordance with the present invention.

TABLE 1

| Analysis atom | FIG. 3a | FIG. 3b | FIG. 3c | FIG. 3d |
|---|---|---|---|---|
| Carbon content (atom %) | 4.5 | 1.3 | 4.1 | 1.0 |
| Oxygen content (atom %) | 17.1 | 20.9 | 11.9 | 2.8 |

Table 1 shows the content of carbon and the content of oxygen obtained from analyses of the surface of the contact hole in each step. The carbon content is 4.5 atom %, and the oxygen content is 17.1 atom % in case of FIG. 3a, while the carbon content is 1.3 atom %, and the oxygen content is 20.9 atom % in case of FIG. 3b when the contact hole 114 is treated using plasma of mixture gas containing oxygen. As can be seen, the carbon content is decreased, and the oxygen content is increased.

The reasons for the decrease in the carbon content and the increase in oxygen content are that the carbon is removed by the plasma treatment, and the semiconductor substrate, which has a silicon surface, is oxidized by the plasma treatment, respectively.

When the contact hole 114 is cleaned after removing the photoresist film pattern 112 as in the case of FIG. 3c the carbon content is 4.1 atom %, and the oxygen content is 11.9 atom %, which means that there is little variation in the carbon content, and a decrease in the oxygen content compared to the case of FIG. 3a.

The decrease in the oxygen content is due to the cleaning process of the contact hole using HF or BOE which is an oxide film removing chemical.

However, when the contact hole 114 is treated using plasma of mixture gas containing oxygen and cleaned after removing the photoresist film pattern 112 as in the case of FIG. 3d the carbon content is 1.0 atom %, and the oxygen content is 2.8 atom %, which means that there are decreases both in the carbon and oxygen contents compared to the case of FIG. 3a.

The decrease in both carbon and oxygen contents are due to removing carbon by the plasma treatment, and the cleaning process of the contact hole using HF or BOE which is an oxide film removing chemical.

As discussed earlier, the method for forming a contact hole of a semiconductor device of the present invention provides a contact hole without any foreign substances which has low contact resistance to the conductive layer formed therein by treating the polymer residual at the bottom of the contact hole with plasma of mixture gas containing oxygen to convert the polymer residual into a pure silicon oxide film free of carbon and flourine for easy removal in the subsequent washing process.

What is claimed is:

1. A method for forming a contact hole of a semiconductor device, comprising the steps of:
   (a) sequentially forming a capping layer and a planarized interlayer insulating film on a semiconductor substrate having a lower structure;
   (b) selectively etching the interlayer insulating film to expose a portion of the capping layer;
   (c) removing the exposed capping layer via a plasma etching process, whereby a polymer residual is generated;
   (d) subjecting the resulting structure to a plasma treatment using a mixture gas containing oxygen to convert the polymer residual into a silicon oxide film; and
   (e) performing a cleaning process to remove the silicon oxide film.

2. The method according to claim 1, wherein the plasma treatment is performed using a plasma of $NF_3/O_2/He$ mixture gas, plasma of $Ar/O_2$ mixture gas, plasma of $CF_4/O_2$ mixture gas or plasma of $CF_4/O_2/Ar$ mixture gas.

3. The method according to claim 1, wherein the step (b), (c) and (d) are performed in a same chamber without intermittence.

4. The method according to claim 1, wherein the step (d) is performed in an ex-situ process in a separate plasma chamber.

* * * * *